(12) United States Patent
Filimonov et al.

(10) Patent No.: US 7,724,837 B2
(45) Date of Patent: May 25, 2010

(54) EFFICIENT MODULATION OF RF SIGNALS

(75) Inventors: Nikolai Filimonov, Moscow (RU); Oleg Varlamov, Moscow (RU); Grigory Itkin, Munich (DE)

(73) Assignee: Sony Ericsson Mobile Communications AB, Lund (SE)

( * ) Notice: Subject to any disclaimer, the term of this patent is extended or adjusted under 35 U.S.C. 154(b) by 1030 days.

(21) Appl. No.: 10/546,012

(22) PCT Filed: Jan. 7, 2004

(86) PCT No.: PCT/EP2004/000047

§ 371 (c)(1),
(2), (4) Date: Jan. 20, 2006

(87) PCT Pub. No.: WO2004/075395

PCT Pub. Date: Sep. 2, 2004

(65) Prior Publication Data

US 2006/0126754 A1 Jun. 15, 2006

(30) Foreign Application Priority Data

Feb. 20, 2003 (EP) .................................. 03003830

(51) Int. Cl.
*H04L 27/00* (2006.01)
(52) U.S. Cl. ..................................... 375/295; 455/126
(58) Field of Classification Search ................. 375/302, 375/395; 455/126
See application file for complete search history.

(56) References Cited

U.S. PATENT DOCUMENTS 4,630,315 A 12/1986 Watkinson (Continued)

FOREIGN PATENT DOCUMENTS

| EP | 1229642 A1 | 8/2002 |
|---|---|---|
| GB | 2150378 A | 6/1985 |
| JP | 60-124127 | 7/1985 |
| WO | WO 00/70746 | 11/2000 |

OTHER PUBLICATIONS

International Search Report corresponding to European Application No. PCT/EP04/000047 mailed Jun. 14, 2004.
International Preliminary Examination Report corresponding to PCT/EP/2004/000047 filed Jan. 7, 2004.

*Primary Examiner*—Chieh M. Fan
*Assistant Examiner*—Freshteh N Aghdam
(74) *Attorney, Agent, or Firm*—Myers Bigel Sibley & Sajovec, P.A.

(57) ABSTRACT

Coherent modulator architectures of wireless communication devices are used for the processing of modulated RF signals. The circuitry comprises a DC/DC converter (204) which serves as an amplitude modulator, different amplification stages (204, 206, 212, 214), a bypass path (215) to selectively bypass at least one (214) of a cascade of class C, D, E, or F power amplifiers (212, 214), and an automatic power control (APC) loop (220) that guarantees power stability over time and temperature variations. To increase the efficiency of the amplification procedures needed for an amplitude modulation, the slow (narrowband) high-level components (222) and the fast (wideband) low-level components (224) of the signal representing the magnitude (I $x_{Lp}$ (t) 1) of an I/Q modulation state ($x_{Lp}$ (t)) are amplified in separate stages (204, 206) and are then combined by supplying the low-level components (224) to a power amplifier (206) whose gain is controlled depending on the amplified high-level components (222). At least one (214) of said cascade of power amplifiers (212, 214) can selectively be bypassed by a bypass circuitry (215), which is used for the sake of efficiency optimization. In the bypass mode, the DC power supply ($V_{bat}$) of the bypassed power amplifier (214) can selectively be switched off by means of a switch (SZ). It is used when the needed RF signal power is low and the driver PA (212) is able to produce enough gain.

18 Claims, 3 Drawing Sheets

U.S. PATENT DOCUMENTS

| | | |
|---|---|---|
| 5,430,416 A | 7/1995 | Black et al. |
| 5,661,434 A | 8/1997 | Brozovich et al. |
| 6,339,694 B1 * | 1/2002 | Komara et al. .............. 455/11.1 |
| 6,795,712 B1 * | 9/2004 | Vakilian et al. .............. 455/522 |
| 6,801,784 B1 * | 10/2004 | Rozenblit et al. ........... 455/522 |
| 6,879,814 B2 * | 4/2005 | Kaikati et al. ............ 455/127.1 |
| 2002/0010010 A1 | 1/2002 | Armaud et al. |
| 2002/0018534 A1 | 2/2002 | Sevenhans et al. |
| 2002/0193085 A1 | 12/2002 | Mathe et al. |
| 2003/0218507 A1 * | 11/2003 | Inoue et al. ................. 330/298 |

\* cited by examiner

EFFICIENT MODULATION OF RF SIGNALS

CROSS-REFERENCE TO RELATED APPLICATIONS

This application claims priority under 35 U.S.C. § 371 from PCT International Application No. PCT/EP2004/000047, filed on Jan. 7, 2004, which claims priority from European Patent Application Serial No. 03003830.1 filed Feb. 20, 2003, the disclosures and contents of which are incorporated by reference herein in their entireties. The above-referenced PCT International Application was published in the English language and has International Publication No. WO 2004/075395.

FIELD AND BACKGROUND OF THE INVENTION

The underlying invention generally relates to the field of modulator architectures of digital communication devices which are used for the processing of modulated RF signals, especially to a power amplifier circuit of a transmitting block for controlling the output power of an RF signal to be transmitted.

The wireless communications area has experienced a remarkable growth, and, as a result, the demand for high-efficient power control circuitries applied to wireless communications devices has increased dramatically. Because in a portable wireless environment all circuits are drawing power from a small battery, one of the most important aspects of circuitdesign. is to optimize the power consumption. Additionally, as wireless communication devices must be realized as low-cost products, the cost of the applied circuits must be reduced as well.

The basic structure of a conventional wireless communication system consisting of a QAM transmitter and a QAM receiver, respectively, is depicted in FIGS. 1$a$+$b$. On the transmitter side 100$a$ of the system, which is shown in FIG. 1$a$, the basic operations are as follows: The digital data is first encoded ($i_k$, $q_k$), and then, after being submitted to an digital-to-analog converter 102, the complex-valued orthogonal in-phase (I) and quadrature (Q) channels are combined by means of a quadrature modulator 104. The resulting signal combination is up-converted to the RF carrier frequency by means of an internal mixing stage. Then, after having passed a filtering stage, the RF signal drives a power amplifier 106, whose output signal x(t) is fed to a transmission (TX) antenna 108. The antenna radiates the signal into the air, and the transmission is complete. The receiver side 100$b$, which is depicted in FIG. 1$b$, is simply the inverse, although slightly different components have to be used. First, the received RF signal x(t) is filtered to select the RF band of interest. After that, it is fed to a low noise amplifier 112 (LNA). The signal is then usually filtered and either directly down-converted from the passband to the baseband (in case of a homodyne receiver) or mixed to one or more intermediate frequency (IF) stages (in case a heterodyne or super-heterodyne receiver is employed). Thereby, the final mixing stage separates the signal into its I and Q components. Once at baseband, the I and Q signals are submitted to an analog-to-digital (A/D) converter 120 before they are further processed.

The power amplifier (PA) is the component of the system that takes the signal to be transmitted and amplifies it to the necessary level needed to drive the antenna for a particular power output level. In most wireless communications systems, the PA is the largest power consumer, usually because the amount of power that needs to be sent to the antenna (the power output) is itself very large. This does not include the total power that is consumed within the PA, just the amount that is required to drive the antenna. The total power consumed by the PA is necessarily greater than the power output, as there will always be some power consumed in the active devices and the peripheral circuitry. Since the power output specification itself is often larger than the power consumption of the rest of the blocks in the RF system and the power consumption of such a PA will be higher than the specified power output, the PA is decidedly the major power consumer of the system.

The signal to be transmitted is often transmitted by applying the output of the PA to a load device, be it a real circuit element or an antenna or similar device. Because the levels of power required to reliably transmit the signal are often quite high, there is a lot of power consumed within the PA. In many wireless applications, the amount of power consumed by this amplifier is not critical; as long as the signal being transmitted is of adequate power, that is good enough. However, in a situation where there is only a limited amount of energy available, which is not sufficient for the transmission procedure, the power consumed by all devices must be minimized, so as to maximize the length of time for which that energy is available.

The number of different classes of power amplifiers which are used today is too numerous to be counted, and they range from entirely linear to entirely non-linear, as well as from quite simple to inordinately complex. In PA terminology, a "linear" power amplifier is one which has a linear relationship between its input and output. Although a PA may comprise transistors operating in a nonlinear fashion (e.g. in case a FET switches between cutoff and saturation), it can still be considered linear. While nonlinear PAs feature a comparatively high efficiency, their nonlinearity causes the output signal to spread (due to intermodulation products, especially if there is a lot of phase noise in the local oscillator which will cause spreading of the input to the PA).

A power amplifier can consist of several serial stages. Each stage is usually more powerful than the previous one. As most of the quiescent current is drawn by the high power stages, which are not required for the low output power levels needed for wireless communication, means for bypassing high power stages when they are not required can lead to a significant reduction of energy consumption.

Since wireless telephones operate on battery power, it is also desirable that their transmitters operate as efficiently as possible to conserve power and extend battery life. Ideally for W-CDMA systems, such as those governed by the UMTS standard, power amplifier stages should be capable of efficient, linear operation in their required dynamic range. However, the prior art has not yet come close to the ideal, and many wireless telephones are having poor power management now. During low power transmissions, power is wasted by cascaded amplifier stages that are not needed. Consequently, attempts have been made to bypass unused stages.

Under normal operating conditions, conventional wireless transceivers devices use an APC circuit to control the output power of their amplification stages. The APC circuit found in most RF transceivers has an external connection that is intended to be connected to a linear power amplifier. After having detected the power of the modulated RF signal at the output of the final power amplifier, said signal is converted to a DC voltage and fed back to a variable-gain intermediate frequency (IF) stage in order to keep the final output power constant over a long period of time. As the APC voltage generation is done very early, the gain drift, which is caused by thermal drift, operating voltage deviation, etc., is not compensated by the circuit. Another option is to derive the ALC voltage from the drive power of the final amplifier and feed it to the external APC input of the RF transceiver. The theory is that when the power amplifier becomes overdriven, it will produce a negative voltage that is fed back into the transceiver's APC circuitry. This voltage acts as a gain control in the transmit stages of the transceiver which, in turn, automatically lowers the drive power (the transceivers output power) and limits distortion from the overdriven amplifier.

FIG. 2a shows a schematic block diagram for a conventional automatic power control (APC) loop according to the state of the art, which is used for stabilizing the signal level at the output port of an analog circuitry realizing an RF signal generator. Thereby, said circuit can also be used for executing an amplitude modulation. It comprises an frequency synthesizing unit (FSU), a power divider (e.g. a directional coupler), which feeds the reflected wave of the modulated RF output signal to a wideband detector diode, and an amplification stage whose output signal is fed to an electronically controllable attenuator (e.g. an amplitude modulator stage realized by means of PIN diodes). In case said RF signal generator is used for sweep-frequency applications, an external detector is usually applied in order to keep the signal level at the input port of a tested RF unit constant. Thereby, it should be noted that the output impedance of the FSU is changed due to the APC loop.

BRIEF DESCRIPTION OF THE STATE OF THE ART

In the U.S. Pat. No. 5,661,434 a high-efficiency multiple-power-level amplifier circuit for reducing power consumption during low-power operations is disclosed. Thereby, a plurality of power amplifier stages are cascaded to provide multiple levels of amplification. At least one power amplification stage includes a signal switching network in order to allow one or any combination of power amplifiers to be switched off when lower power operations are desired. The switched off power amplifiers are biased such that substantially no current is drawn from the power source.

A system and method for amplification of a communication signal is disclosed in the patent application publication US 2002/0193085 A1. This system and method comprises the features of the preambles of the independent claims.

According to US 2002/0193085 A1 bandwidth reduction of amplitude and/or phase components of relatively wide bandwidth composite signal. In an example, an EER amplifier system for CDMA signal amplification includes an amplitude bandwidth reduction module included in an amplitude signal component path and a phase bandwidth reduction module is included in a phase signal component path, for controlling an RF amplifier. The phase bandwidth reduction module may reduce the phase component bandwith of the input signal by, for example, generating a non-linear relationship between phase signal amplitude and input signal amplitude. The amplitude bandwidth reduction module may reduce the amplitude component bandwidth of the input signal by, for example, generating a non-linear relationship between the supply voltage to the RF amplifier and an input signal amplitude.

The European patent application EP 1 229 642 A1 pertains to a power amplifier circuit of a mobile transmitter unit for amplifying an input RF signal comprising an amplification path for amplifying an input RF-signal, a bypass path for bypassing the amplification path and a control terminal for controlling the operation mode of the power amplifier circuit between an amplifying mode and a bypassing mode. Thus, the input RF-signal is either amplified by the amplification path in the amplifying mode or bypassed by the bypass path in the bypassing mode. The bypass path is designed in such a way that it substantially does not affect the output RF transmission signal in the amplifying mode and that there is no need for a serial switch in the signal path of the bypass path. However, EP 1 229 642 A1 describes only the final stage of the transmitter unit and the possibility to bypass the final power amplifier stage in order to save DC energy when transmitting low-power signals.

A process for reducing the power consumption of a wireless transmitter and/or receiver, in particular a cellular mobile telephone with a corresponding transmitter and receiver unit, is disclosed in the US patent No. 2002/0010010 A1. Thereby, power consumption is reduced by using fractional-division phase-locked loops (PLLs) receiving a frequency reference from a fairly inaccurate quartz oscillator. Power consumption is also reduced by switching the output of the oscillator onto the input of the processing stage where the transmission/reception stage is inactive. The fractional-division PLLs can then be deactivated.

In the US patent 2002/0018534 A1 a multiplier arrangement (MUXER) is disclosed which is adapted to generate the components of a high-frequency phase vector from analog phase information and high-frequency local oscillator (LO) signals as well as to synthesize the phase vector from said components within a summing means. It is furthermore adapted to provide said phase vector as a vector which is making an excursion alongside the contours of a square within the complex plane during a first category of predetermined transitions of a phase signal on which said analog phase information is dependent. A signal modulator including such a multiplier arrangement as well as a transmitter are described as well.

Moreover, in the U.S. Pat. No. 5,003,270 an improved circuit for controlling the output power level of a radio frequency (RF) amplifier is disclosed. Thereby, the circuit samples the output of an RF amplifier. These samples are amplitude-modulated at a preselected modulation frequency and passed to a detector. In response to the amplitude-modulated signal, the detector produces a signal whose amplitude is indicative of the respective RF amplifier's output power and whose frequency is the modulation frequency. The amplitude of the signal produced by the detector is then compared to a reference amplitude, and the difference (the error signal) is used to control the gain of the RF amplifier.

A method and apparatus for linearizing an efficient class D/E power amplifier using delta modulation and a delta-modulated power supply, respectively, are disclosed in the two U.S. Pat. Nos. 5,847,602 and 5,973,556. Thereby, a delta-modulated magnitude amplifier is used to amplify the magnitude component of an RF power amplifier which employs envelope elimination and restoration. The delta-modulated amplifier introduces a smaller amount of non-linearity than traditional approaches, which are based upon pulse-width modulation. The disclosed technique can be implemented by using switched-capacitor circuits in a standard MOS technology with only two external components, e.g. an inductor and a capacitor. Thus, the disclosed technique allows the implementation of an efficient and yet linear RF power amplifier using low-cost MOS technology.

The invention disclosed in the U.S. Pat. No. 6,377,784 describes a high-efficiency power control of a high-efficiency (e.g. hard-limiting or switch-mode) power amplifier which is used to achieve a desired amplitude modulation. In one embodiment, the spread between a maximum frequency of the desired modulation and the operating frequency of a switch-mode DC/DC converter is reduced by following the switch-mode converter with an active linear regulator. Said regulator is designed to control the operating voltage of the power amplifier with sufficient bandwidth to faithfully reproduce the desired amplitude modulation waveform. The linear regulator is further designed to reject variations on its input voltage, even while the output voltage is changed in response to an applied control signal. This rejection occurs even though the variations on the input voltage are of commensurate or even lower frequency than that of the controlled output variation. In this connection, amplitude modulation may be achieved by either directly or effectively varying the operating voltage of the power amplifier while simultaneously achieving high efficiency in the conversion of primary DC power to the amplitude-modulated output signal. High efficiency is enhanced by allowing the switch-mode DC/DC converter to also vary its output voltage such that the voltage drop across the linear regulator is kept at a low and relatively constant level. Time-division multiple access (TDMA) bursting capability may be combined with efficient amplitude modulation, with control of these functions being combined. In addition, the variation of average output power level in accordance with commands from a communications system may also be combined within the same structure.

OBJECT OF THE UNDERLYING INVENTION

In view of the state of the art mentioned above, it is the object of the underlying invention to provide a particular efficient and flexible technique for modulating radio frequency (RF) signals.

The invention particularly deals with an optimization of the different amplification stages of a modulator.

The aforementioned object is achieved by means of the features in the independent patent claims. Advantageous features are defined in the dependent patent claims.

SUMMARY OF THE INVENTION

According to a first aspect of the invention, method for I/Q modulation is proposed, wherein the in-phase (I) and quadrature (Q) component of a complex-valued analog baseband input signal ($x_{LP}(t)$) are converted to signals representing the magnitude ($|x_{LP}(t)|$) and phase ($\angle x_{LP}(t)$) of the I/Q modulation states ($x_{LP}(t)$), respectively and the envelope ($|x_{LP}(t)|$) and phase signals ($\angle x_{LP}(t)$) are combined to generate a modulated RF output transmission signal ($x(t)$).

Thereby slow high-level components and fast low-level components of the signal representing the magnitude ($|x_{LP}(t)|$) of an I/Q modulation state ($x_{LP}(t)$) are amplified in separate stages. The slow high-level components of the signal representing the magnitude ($|x_{LP}(t)|$) of an I/Q modulation state ($x_{LP}(t)$) can be amplified using a DC/DC converter.

Slow high-level components and fast low-level components of the signal representing the magnitude ($|x_{LP}(t)|$) of an I/Q modulation state ($x_{LP}(t)$) can be combined ($x_{MC}(t)$) by supplying the low-level components to a power amplifier whose gain is controlled depending on the amplified high-level components.

The combined envelope ($|x_{LP}(t)|$) representing signal ($x_{MC}(t)$) can be controlling the gain of at least one further power amplifier supplied with an RF signal ($x_P(t)$) modulated with the phase information ($\angle x_{LP}(t)$) of the I/Q modulation states ($x_{LP}(t)$).

A signal ($x_{MC}(t)$) representing the magnitude ($|X_{LP}(t)|$) of the I/Q modulation states can control the gain of several of serially connected power amplifiers, wherein the most upstream one (212) of the cascade of power amplifiers is supplied with an RF signal ($x_P(t)$) carrying the phase information ($\angle x_{LP}(t)$) of the I/Q modulation states ($x_{LP}(t)$).

At least one of the cascade of power amplifiers can be selectively bypassed.

The power supply ($V_{bat}$) of the bypassed power amplifier can be selectively switched off.

The signal ($x_{MC}(t)$) representing the magnitude ($|x_{LP}(t)|$) of the I/Q modulation states ($x_{LP}(t)$) and controlling the gain of one of said serially connected power amplifiers can be selectively dampened.

The high-level components of the signal ($x_{MC}(t)$) representing the magnitude ($|x_{LP}(t)|$) of an I/Q modulation state ($x_{LP}(t)$) are represented by a ramp signal supplied from a baseband block to an amplifier.

According to a further aspect of the present invention a method for selectively carrying out a frequency or I/Q modulation is proposed, wherein the in-phase (I) and quadrature (Q) component of a complex-valued analog baseband input signal ($x_{LP}(t)$) is converted to signals representing the magnitude ($|x_{LP}(t)|$) and phase ($\angle x_{LP}(t)$) of the I/Q modulation states ($x_{LP}(t)$) respectively and the envelope ($|x_{LP}(t)|$) and phase signals ($\angle x_{LP}(t)$) are combined to generate a modulated RF output transmission signal ($x(t)$), Thereby the power ($p_x(t)$) of the modulated RF output transmission signal ($x(t)$) is selectively fed back to provide an automatic power-controlled (APC) loop.

The APC loop can be opened in case of I/Q modulation as soon as the power ($p_x(t)$) of the modulated RF output transmission signal ($x(t)$) reaches a defined nominal value ($P_0$).

According to a still further aspect of the present invention a I/Q modulator is proposed designed to carry out a method as set forth above.

According to a still further aspect of the present invention a I/Q modulator is proposed, comprising a unit (208) for converting the in-phase (I) and quadrature (Q) component of a complex-valued analog, baseband input signal ($x_{LP}(t)$) to signals representing the magnitude ($|x_{LP}(t)|$) and phase ($\angle x_{LP}(t)$) of the I/Q modulation states ($x_{LP}(t)$), respectively, and a unit (212) for combining the magnitude ($|x_{LP}(t)|$) and phase signals ($\angle x_{LP}(t)$) to generate a modulated RF output transmission signal ($x(t)$), The I/Q modulator can comprise separate stages for amplifying slow high-level components and fast low-level components of the signal representing the magnitude ($|x_{LP}(t)|$) of an I/Q modulation state ($x_{LP}(t)$), respectively.

A DC/DC converter can amplify the slow high-level components of the signal ($x_{MC}(t)$) representing the magnitude ($|x_{LP}(t)|$) of an I/Q modulation state ($x_{LP}(t)$).

A power amplifier can be present supplied with the fast low-level components and gain-controlled depending on the amplified slow high-level components in order to combine the slow high-level components and fast low-level components of the signal ($x_{MC}(t)$) representing the magnitude ($|x_{LP}(t)|$) of an I/Q modulation state ($x_{LP}(t)$).

At least one further power amplifier can be present being supplied with an RF signal ($x_P(t)$) modulated with the phase information ($\angle X_{LP}(t)$) of the I/Q modulation states ($x_{LP}(t)$) and being gain-controlled by the combined envelope ($|x_{LP}(t)|$) representing signal ($x_{MC}(t)$).

Several serially connected power amplifiers can be provided being gain-controlled by a signal ($x_{MC}(t)$) representing the magnitude ($|x_{LP}(t)|$) of the I/Q modulation states ($x_{LP}(t)$), wherein the most upstream one of the cascade of power amplifiers is supplied with an RF signal ($x_P(t)$) carrying the phase information ($\angle x_{LP}(t)$) of the I/Q modulation states ($x_{LP}(t)$).

A switch can be provided to selectively bypass at least one of the cascade of power amplifiers.

A switch can be provided to selectively switch off the power supply ($V_{bat}$) of the bypassed power amplifier.

A switch ($S_1$) to selectively dampen the signal ($x_{MC}(t)$) representing the magnitude ($|x_{LP}(t)|$) of the I/Q modulation states ($x_{LP}(t)$) and controlling the gain of one of said serially connected power amplifiers.

The power amplification circuit according to the present invention can advantageously be used in wireless communication devices which are capable of transmitting wireless signals according to the GSM, EDGE or UMTS standard.

BRIEF DESCRIPTION OF THE DRAWINGS

Advantageous features, aspects, and advantages of the invention will become evident from the following description, the appended claims, and the accompanying drawings. Thereby.

DETAILED DESCRIPTION OF THE UNDERLYING INVENTION

Figure 1A:
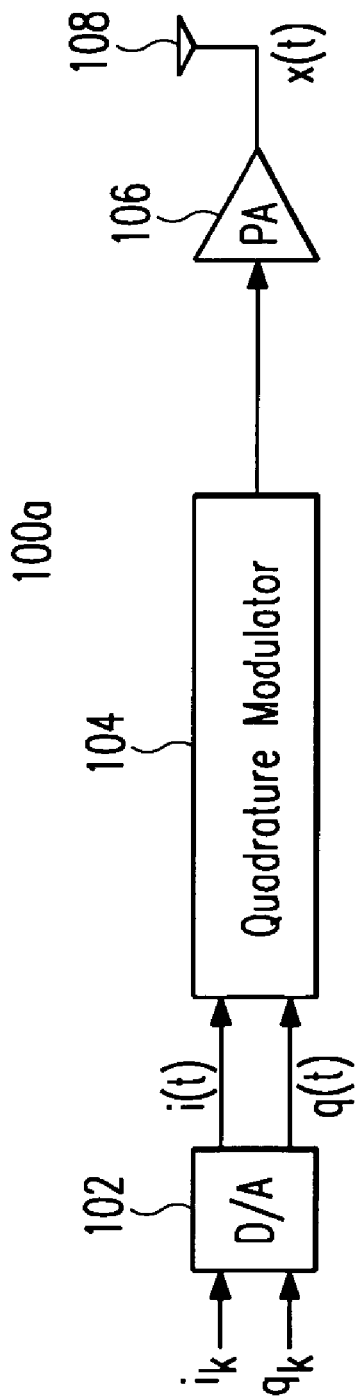
FIG. 1a presents a schematic block diagram of a conventional QAM transmitter using an I/Q modulator according to the state of the art.
Figure 1B:
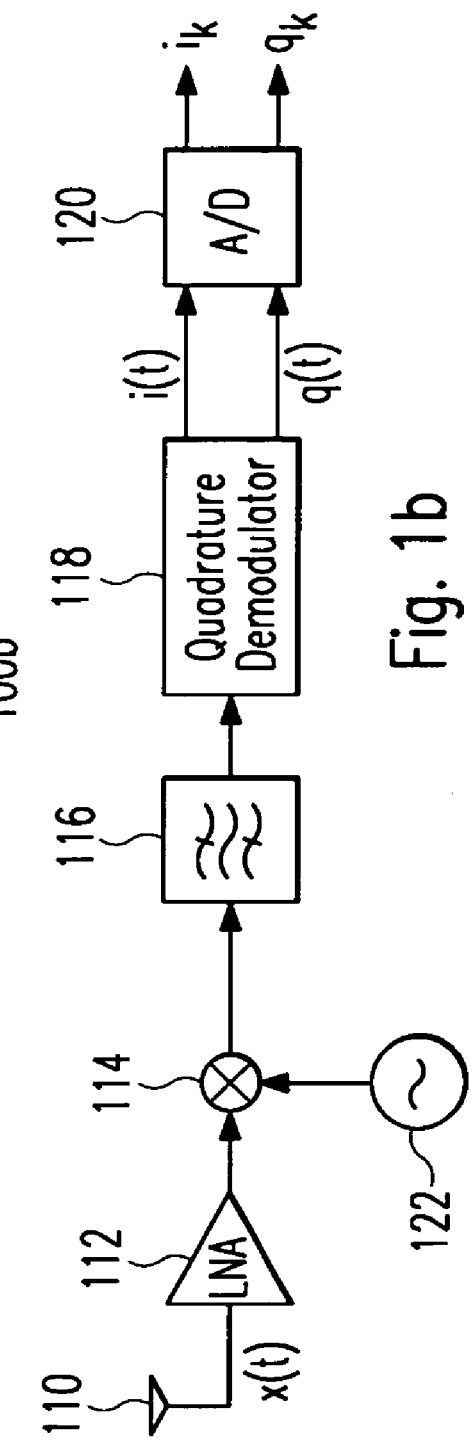
FIG. 1b presents a schematic block diagram of a conventional QAM receiver using an I/Q demodulator according to the state of the art.
Figure 2A:
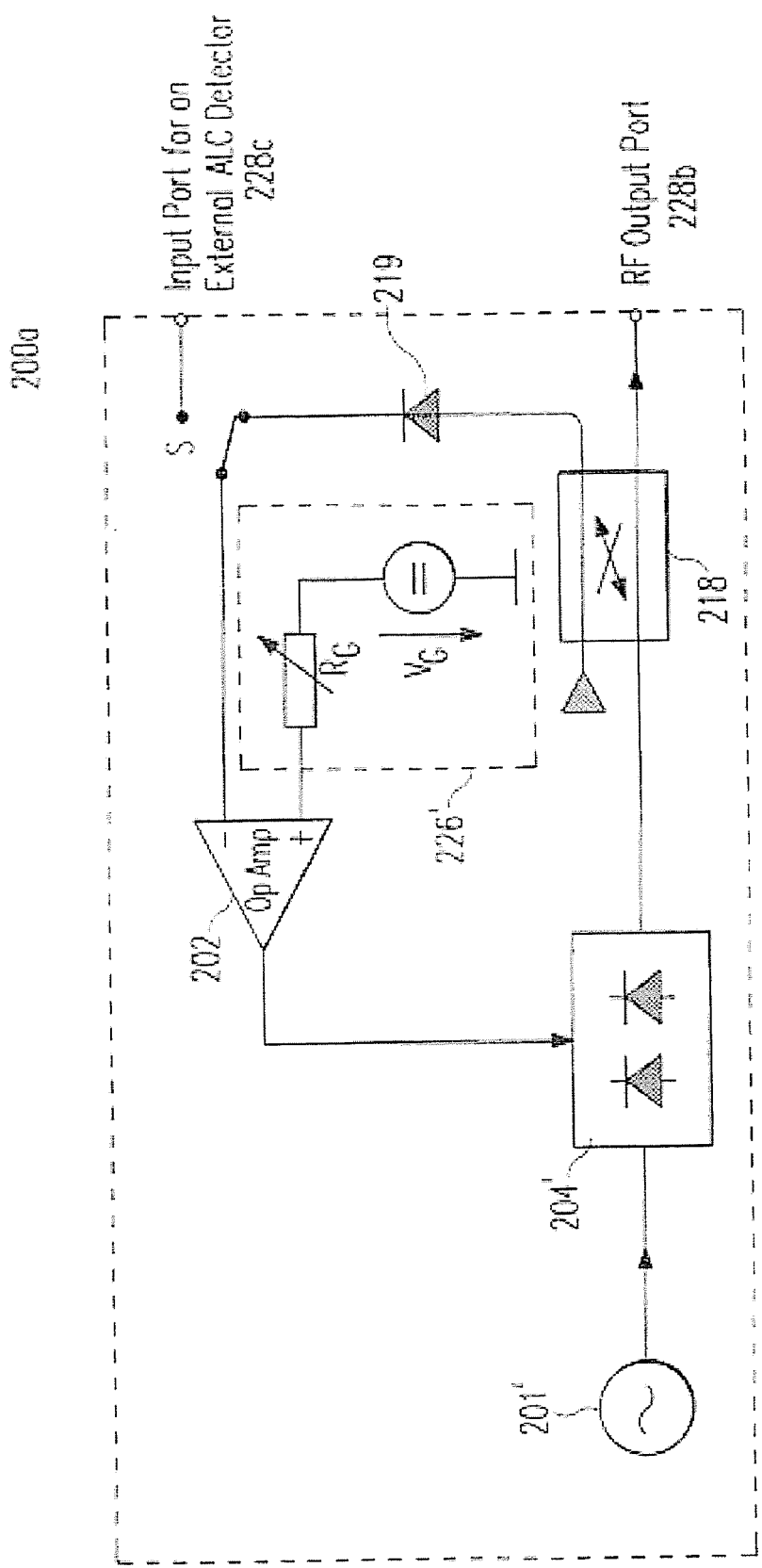
FIG. 2a shows a schematic block diagram for a conventional automatic level control (ALC) loop, which is used for stabilizing the signal level at the output port of an analog circuitry realizing a measurement generator.
Figure 2B:
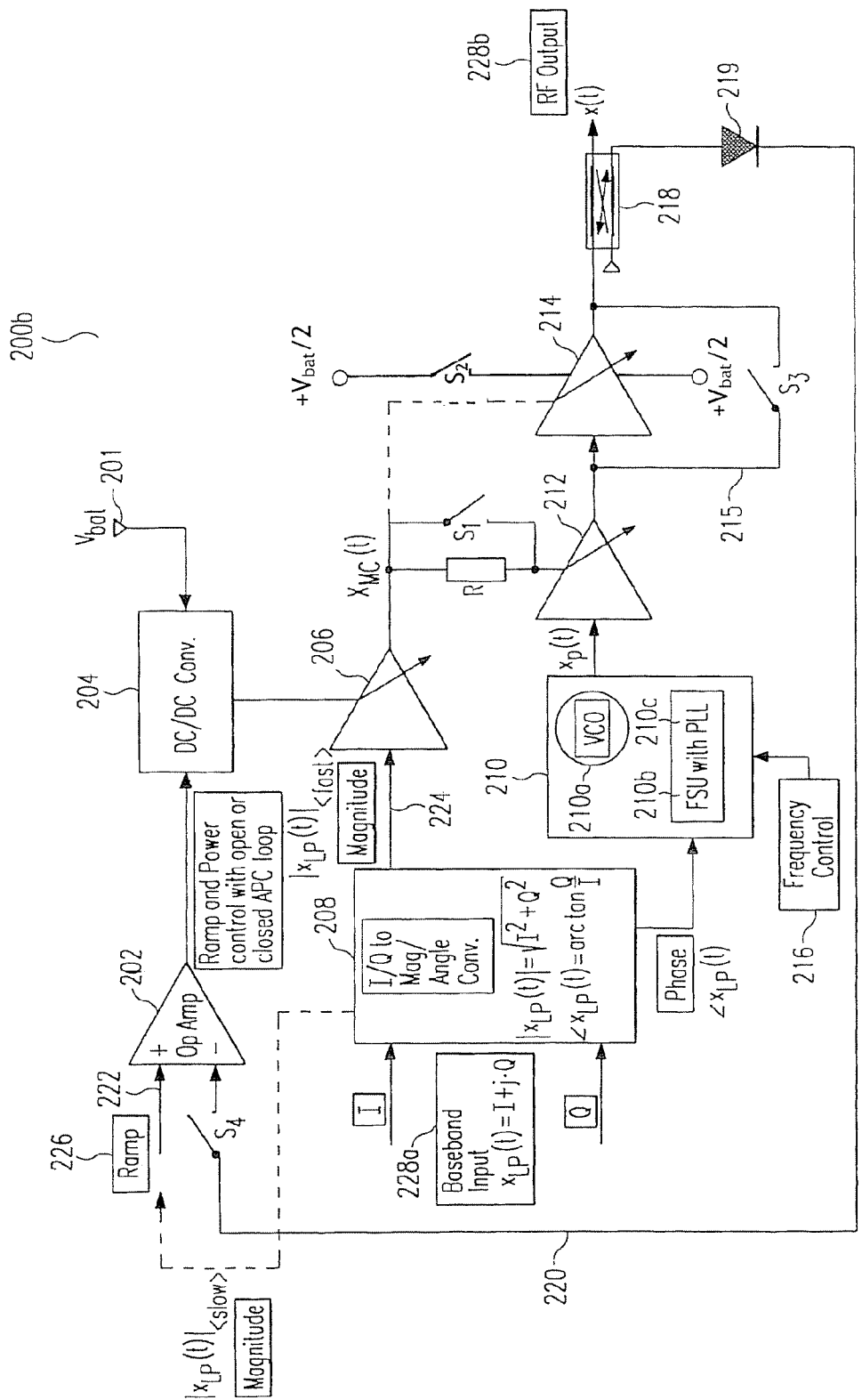
FIG. 2b depicts a schematic block diagram of a QAM transmitter with an I/Q modulator.

In the following, one embodiment of the underlying invention as depicted in FIG. 2b shall be explained in detail. The meaning of the symbols designated with reference signs in FIGS. 1a to 2b can be taken from an annexed table.

In the shown I/Q modulator 200b the in-phase (I) and quadrature (Q) component of a complex-valued analog baseband input signal $x_{LP}(t)$ are supplied from a baseband input 228a and then converted to signals representing the magnitude $|x_{LP}(t)|$ and phase $\angle x_{LP}(t)$ of the I/Q modulation states $x_{LP}(t)$, respectively, in a processing block 208.

Note that the baseband input may already consist of a signal representing the magnitude $|x_{LP}(t)|$ and phase $\angle x_{LP}(t)$ of the I/Q modulation states $x_{LP}(t)$, respectively, in which alternative case the conversion block 208 is not necessary.

The amplitude $|x_{LP}(t)|$ and phase signals $\angle x_{LP}(t)$ are separately processed and then combined in a series of amplification stages 212, 214, to generate a modulated RF output transmission signal $x(t)$.

The baseband and/or the conversion unit 208 are thereby designed to split the signal representing the magnitude $|x_{LP}(t)|$ of an I/Q modulation state $x_{LP}(t)$ in a first branch 224b for slow high-level components and a second branch 224a for fast low-level components. According to the invention, these two branches are processed separately. F.e. slow high-level components 222 represented in a ramp signal 226 and fast low-level components 224 of the signal representing the magnitude $|x_{LP}(t)|$ of an I/Q modulation state $x_{LP}(t)$ are amplified in separate stages 204, 206.

The slow (narrowband) high-level components 222 of the signal representing the magnitude $|x_{LP}(t)|$ of an I/Q modulation state $x_{LP}(t)$ are f.e included in a ramp signal (this is known as such from the UMTS and EDGE specifications) fed to an OP amplifier 202 (which second inverted input is optionally supplied with a feedback signal as will be explained later) and finally amplified using a DC/DC converter 204 supplied with a battery DC voltage 201.

The slow (narrowband) high-level components 222 and fast (wideband) low-level components 224a of the signal representing the magnitude $|x_{LP}(t)|$ of an I/Q modulation state $x_{LP}(t)$ are combined by supplying the low-level components 224a to a power amplifier 206 whose gain is controlled by the output of the DC/DC converter 204 and thus depending on the amplified high-level components 222.

The phase modulation of the analog phase signal ($\angle x_{LP}(t)$) out put by the conversion block 208 (or directly by the baseband) is performed by an up-conversion mixing stage 210 comprising a frequency-synthesizing unit 210b (FSU) equipped with a voltage-controlled oscillator 210a (VCO), whose output frequency is controlled by an external frequency control circuit 216, and a phase-locked loop 210c (PLL) which is used for compensating phase instabilities of the VCO 210a.

The combined envelope-representing signal $x_{MC}(t)$ output by the wide-band amplifier 206 is selectively dampened (see resistor R and switch S1) controls the gain of at least one further power amplifier 212 supplied with the output signal of the up-conversion mixing stage 210, i.e. the RF signal $x_P(t)$ modulated with the phase information $\angle x_{LP}(t)$ of the I/Q modulation states $x_{LP}(t)$. Thus, the modulated RF transmission signal $x(t)$ is obtained by a multiplication of the combined amplitude representing component $x_{MC}(t)$ and the phase-modulated RF carrier $x_P(t)$.

According to a further embodiment of the invention, a signal $x_{MC}(t)$ representing the magnitude $|x_{LP}(t)|$ of the I/Q modulation states controls the gain of several of serially connected power amplifiers 212, 214, wherein the most upstream one (212) of the cascade of power amplifiers 212, 214 is supplied with an RF signal $x_P(t)$ carrying the phase information $\angle x_{LP}(t)$ of the I/Q modulation states $x_{LP}(t)$. Thereby, at least one 214 of the cascade of power amplifiers 212, 214 can be selectively bypassed by means of a switch S3. In the bypass case, the power supply $V_{bat}$ of the bypassed power amplifier 214 can be selectively switched off by a switch S2. With other words, the switch S3 is closed by a control unit (not shown) when the switch S2 is opened (and otherwise).

The power amplifier circuit according to the underlying invention works as follows: In the amplifying mode (high power mode), an input RF signal is amplified by the amplification path 212, 214, while the bypass path 215 in this mode does not influence the amplification path 3 operation. In the bypassing mode (low power mode) with closed switch S3, an input RF signal passes the power amplifier circuit output through the bypass path 215 without considerable changes in signal power. In this mode, the final power amplifier 214 does not affect the bypass path operation at all. As a result, when operating in the broadband spectrum of the required output signal, a significant decrease in the average consumed current of the amplification means 4 can be achieved.

The signal $x_{MC}(t)$ representing the magnitude $|x_{LP}(t)|$ of the I/Q modulation states $x_{LP}(t)$ and controlling the gain of one (212) of said serially connected power amplifiers can be selectively dampened by means of resistor R in case switch $S_1$ is open. The small "modulation" in the amplifier 212 through the resistor R is added to enable the use of a high efficient Class C amplifier as amplifier 212 to carry out a low distortion collector or source amplitude modulation.

Note that in case the bypass mode 215 for the following amplifer 214 is used by closing the switch S3, the switch S1 is also closed (by a control unit not shown) and the small dampened modulation of the amplifier 212 is thus changed to the full value.

Now the APC (automatic power control) loop 220 will be explained: The small part of the output signal power $p_x(t)$, which is extracted by means of a directional coupler 218, is detected by an amplitude detector, amplified and selectively (switch S4) fed back to the inverting input of the operation amplifier 202 in order to provide an automatic power-controlled (APC) loop 220.

The APC loop 220 is closed/opened depending on the modulation scheme (frequency modulation as in case of GSM or QAM or higher as in case of UMTS and EDGE) and the operation state of the transmitter as will be explained in the following:

In UMTS or EDGE the switch S4 is open and the ouput signal of the OP amplifier 202 thus contains the amplitude information coming from the baseband and included in the ramp signal 226. When processing EDGE signals, however, the APC loop can be closed until the signal power reaches a defined nominal value. At this moment the APC loop is opened as otherwise the amplitude information would be detoriated.

When transmitting frequency modulated GSM signals, the APC loop is closed and the well-known GSM ramp power controll (power-up and power-down) is carried out. No amplitude modulatin is carried out.

A further embodiment of the underlying invention pertains to an I/Q modulator 200, which comprises a unit 208 for converting the in-phase (I) and quadrature (Q) component of a complex-valued analog baseband input signal $x_{LP}(t)$ to signals representing the magnitude $|x_{LP}(t)|$ and phase $\angle x_{LP}(t)$ of the I/Q modulation states $x_{LP}(t)$, respectively, and a unit 212 for combining the amplitude $|x_{LP}(t)|$ and phase signals $\angle x_{LP}(t)$ to generate a modulated RF output transmission signal x(t). Thereby, said I/Q modulator 200 comprises separate stages 204, 206 for amplifying slow high-level components 222 and fast low-level components 224 of the signal representing the magnitude $|x_{LP}(t)|$ of an I/Q modulation state $x_{LP}(t)$, respectively.

In this connection, the slow high-level components 222 of the signal $x_{MC}(t)$ representing the magnitude $|x_{LP}(t)|$ of an I/Q modulation state $x_{LP}(t)$ are amplified by means of a DC/DC converter 204.

A first power amplifier 206 providing a pre-amplification stage is supplied with the fast low-level components 224 and gain-controlled depending on the pre-amplified slow high-level components 222 in order to combine the slow high-level components 222 and fast low-level components 224 of the signal $x_{MC}(t)$ representing the magnitude $|x_{LP}(t)|$ of an I/Q modulation state $x_{LP}(t)$. The I/Q modulator 200 comprises at least one further power amplifier 212 being supplied with an RF signal $x_P(t)$ modulated with the phase information $\angle x_{LP}(T)$ of the I/Q modulation states $x_{LP}(t)$ and being gain-controlled by the combined envelope-representing signal $x_{MC}(t)$.

According to another embodiment of the underlying invention, several serially connected power amplifiers 212, 214, which are gain-controlled by a signal $x_{MC}(t)$ representing the magnitude $|x_{LP}(t)|$ of the I/Q modulation states $x_{LP}(t)$, wherein the most upstream one (212) of the cascade of power amplifiers 212, 214 is supplied with an RF signal $x_P(t)$ carrying the phase information $\angle x_{LP}(t)$ of the I/Q modulation states $x_{LP}(t)$, are employed.

For the sake of efficiency optimization, at least one (214) of the cascade of power amplifiers 212, 214 can selectively be bypassed by a bypass circuit 215, which is activated when switch $S_3$ is closed. In the bypass case, the power supply $V_{bat}$ of the bypassed power amplifier 214 can selectively be switched off by means of another switch ($S_2$). The bypass mode should be used when the needed RF signal power is low and the driver PA 212 is able to produce enough gain. In this connection, switch $S_2$ helps to reduce energy consumption as some PA chips do not have any power saving mode. According to another embodiment, the signal $x_{MC}(t)$, a switch ($S_1$) is used to selectively dampen the signal $x_{MC}(t)$ representing the magnitude $|x_{LP}(t)|$ of the I/Q modulation states $x_{LP}(t)$ by means of a resistor R and control the gain of one (212) of said serially connected power amplifiers 212, 214. All switches can be realized by the use of PIN diodes or MOS field effect transistors (FETs).

Finally, another embodiment of the invention refers to a wireless transmitter and a mobile communication device, wherein an I/Q modulator 200 as described above is applied.

The proposed technique thus allows universal transmitter supporting different standards of cellular communication systems (and also multistandard environments). The transmitter can be set to different high efficient modes for different standards such as f.e. QAM (CDMA, WCDMA or EDGE) and GMSK.

TABLE

Depicted Features and Their Corresponding Reference Signs

| No. | Technical Feature or System Component |
|---|---|
| 100a | schematic block diagram of a conventional QAM transmitter using an I/Q modulator according to the state of the art |
| 100b | schematic block diagram of a conventional QAM receiver using an I/Q demodulator according to the state of the art |
| 102 | digital-to-analog (D/A) converter in the transmission chain of the QAM transmitter 100a |
| 104 | I/Q modulator in the transmission chain of the QAM transmitter 100a |
| 106 | power amplifier in the transmission chain of the QAM transmitter 100a |
| 108 | transmitting (TX) antenna of the QAM transmitter 100a |
| 110 | receiving (RX) antenna of the QAM receiver 100b |
| 112 | low noise amplifier (LNA) in the reception chain of the QAM receiver 100b |
| 114 | down-conversion mixer in the reception chain of the QAM receiver 100b |
| 116 | band-pass filter (BPF) in the reception chain of the QAM receiver 100b |
| 118 | I/Q demodulator in the reception chain of the QAM receiver 100b |
| 120 | analog-to-digital (A/D) converter in the reception chain of the QAM receiver 100b |
| 122 | local oscillator (LO) of the QAM receiver 100b |
| 200a | schematic block diagram of a conventional automatic level control (ALC) loop according to the state of the art, which is used for stabilizing the signal level at the output port of an analog circuitry realizing an RF signal generator |
| 200b | schematic block diagram of a practical QAM transmitter with an I/Q modulator, which comprises a power amplifier circuitry according to the underlying invention |
| 201 | DC power supply ($V_{bat}$) for the I/Q modulator of the QAM transmitter 200b |
| 201' | frequency synthesizing unit (FSU) of the RF signal generator 200a |
| 202 | operation amplifier (Op Amp), supplied with the high-level components 222 of the signal $x_{MC}(t)$ representing the magnitude $|x_{LP}(t)|$ of an I/Q modulation state $x_{LP}(t)$, which are represented by a ramp signal 226 supplied from a baseband block |

TABLE-continued

Depicted Features and Their Corresponding Reference Signs

| No. | Technical Feature or System Component |
|---|---|
| 204 | DC/DC converter amplifying the slow (narrowband) high-level components of the signal $x_{MC}(t)$ representing the magnitude $|x_{LP}(t)|$ of an I/Q modulation state $x_{LP}(t)$ |
| 204' | electronically controllable attenuator of the RF signal generator 200a (e.g. an amplitude modulator stage realized by means of PIN diodes) |
| 206 | gain-controlled power amplifier (VGA), operated at audio frequency (AF), which is used for amplifying the fast (wideband) low-level components 224 of the signal representing the magnitude $|x_{LP}(t)|$ of an I/Q modulation state $x_{LP}(t)$, respectively, and whose gain is controlled depending on the amplified slow (narrowband) high-level components 222 |
| 208 | I/Q-to-magnitude/angle converter for converting the inphase (I) and quadrature (Q) component of a complex-valued analog baseband input signal ($x_{LP}(t)$) to signals representing the magnitude ($|x_{LP}(t)|$) and phase ($\angle x_{LP}(t)$) of the I/Q modulation states ($x_{LP}(t)$), respectively |
| 210 | up-conversion mixing stage used for a phase modulation of the phase information ($\angle x_{LP}(t)$) of the I/Q modulation states ($x_{LP}(t)$, which comprises a frequency-synthesizing unit (FSU) with a phase-locked loop (PLL) and a voltage-controlled oscillator (VCO) |
| 210a | voltage-controlled oscillator (VCO) of the circuitry 210 |
| 210b | frequency-synthesizing unit (FSU) with a phase-locked loop (PLL) |
| 212 | gain-controlled power amplifier (VGA), operated at radio frequency (RF) and realized as a class C driver PA, supplied with an RF signal ($x_p(t)$) modulated with the phase information ($\angle x_{LP}(t)$) of the I/Q modulation states ($x_{LP}(t)$) |
| 214 | power amplifier, operated at radio frequency (RF) and realized as a class C, D, E, or F driver PA, which can selectively be bypassed by means of a bypass circuit, which is activated when switch $S_3$ is closed, while, simultaneously, its power supply $V_{bat}$ is switched off by means of switch $S_2$ |
| 215 | bypass path for bypassing the power amplifier 214 |
| 216 | frequency control circuit for the frequency synthesizing unit (FSU) 210b of the upconversion mixing stage 210 |
| 218 | power divider (here: directional coupler), which supplies the APC loop 220 with the extracted feedback signal (the small part of the RF signal power) |
| 219 | wideband detector diode for detecting said feedback signal |
| 219' | external power APC detector |
| 220 | automatic power control (APC) loop, which guarantees excellent output power stability over time and temperature variations |
| 222 | fast (wideband) low-level components of the signal representing the magnitude $|x_{LP}(t)|$ of an I/Q modulation state $x_{LP}(t)$ |
| 224 | slow (narrowband) high-level components of the signal representing the magnitude $|x_{LP}(t)|$ of an I/Q modulation state $x_{LP}(t)$ |
| 226 | ramp signal supplied from a baseband block to the amplifier 202 |
| 226' | analog baseband circuit for generating an analog baseband signal to be transmitted |
| 228a | baseband input port of the QAM transmitter |
| 228b | passband (RF) output port of the QAM transmitter |
| 228c | input port for an external powerdetector 219' |
| R | resistor used for selectively dampening the signal $x_{MC}(t)$ representing the magnitude $|x_{LP}(t)|$ of the I/Q modulation states $x_{LP}(t)$, which represents the gain of power amplifier 212, in case switch $S_1$ is opened |
| S | switch used for choosing an internal or external APC detector 219' |
| $S_1$ | switch used for controlling the gain of power amplifier 212 |
| $S_2$ | switch used for selectively switching off the power supply $V_{bat}$ of the bypassed power amplifier 214 |
| $S_3$ | switch used for selectively bypassing at least one (214) of the series of power amplifiers 212, 214 |
| $S_4$ | switch used for opening the APC loop 220 as soon as the power $p_x(t)$ of the modulated RF output transmission signal $x(t)$ reaches a defined nominal value $P_0$ |

The invention claimed is:

1. A method for I/Q modulation, the method comprising:

converting an in-phase (I) and a quadrature (Q) component of a complex-valued analog baseband input signal into signals representing a magnitude and a phase of I/Q modulation states of the complex-valued analog baseband input signal, respectively; and combining the signals representing the magnitude and phase to generate a modulated RF output transmission signal, wherein slow high-level components and fast low-level components of the signal representing the magnitude are amplified in separate amplifier stages, and wherein the slow high-level components and the fast low-level components of the signal representing the magnitude are combined to provide a combined envelope representing signal by supplying the low-level components to a power amplifier whose gain is controlled based on the amplified high-level components.

2. A method according to claim 1, wherein the slow high-level components of the signal representing the magnitude are amplified using a DC/DC converter.

3. A method according to claim 1, wherein the combined envelope representing signal controls a gain of at least a second power amplifier supplied with an RE signal modulated with the signal representing the phase.

4. A method according to claim 1, wherein the combined envelope representing signal controls a gain of at least one of a plurality of serially connected power amplifiers, and wherein a first one of the plurality of power amplifiers is supplied with an RF signal based on the signal representing the phase.

5. A method according to claim 4, wherein at least one of the plurality of power amplifiers is configured to be selectively bypassed.

6. A method according to claim 5, wherein a power supply of a bypassed one of the plurality of power amplifiers is configured to be selectively switched off.

7. A method according to claim 4, wherein the combined envelope representing signal is configured to be selectively dampened.

8. A method according to claim 1, wherein the high-level components of the signal representing the magnitude are represented by a ramp signal supplied from a baseband block to an amplifier.

9. An I/Q modulator configured to carry out a method according to claim 1.

10. An I/Q modulator, comprising:

a conversion unit configured to convert an in-phase (I) and a quadrature (Q) component of a complex-valued analog baseband input signal into signals representing a magnitude and a phase of I/Q modulation states of the complex-valued analog baseband input signal, respectively;

a combination unit configured to combine the signals representing the magnitude and phase to generate a modulated RF output transmission signal;

a first amplifier stage configured to amplify slow high-level components of the signal representing the magnitude;

a second amplifier stage configured to amplify fast low-level components of the signal representing the magnitude; and a power amplifier supplied with the fast low-level components and having a gain controlled based on the amplified slow high-level components, wherein the power amplifier is configured to combine the slow high-level components and fast low-level components of the signal representing the magnitude to provide a combined envelope representing signal.

11. A modulator according to claim 10, further comprising:
a DC/DC converter configured to amplify the slow high-level components of the signal representing the magnitude.

12. A modulator according to claim 10, further comprising:
a second power amplifier supplied with an RF signal modulated with the signal representing the phase and having a gain controlled by the combined envelope representing signal.

13. A modulator according to claim 10, further comprising:
a plurality of serially connected power amplifiers having respective gains controlled by the combined envelope representing signal,
wherein a first one of the plurality of power amplifiers is supplied with an RF signal based on the signal representing the phase.

14. A modulator according to claim 13, further comprising:
a switch configured to selectively bypass at least one of the plurality of power amplifiers.

15. A modulator according to claim 14, further comprising:
a second switch configured to selectively switch off a power supply of a bypassed one of the plurality of power amplifiers.

16. A modulator according to claim 13, further comprising:
a switch configured to selectively dampen the combined envelope representing signal.

17. A wireless transmitter, comprising:
an I/Q modulator according to claim 10.

18. A mobile telecommunications device, comprising:
an I/O modulator according to claim 10.

* * * * *

UNITED STATES PATENT AND TRADEMARK OFFICE
CERTIFICATE OF CORRECTION

| | | |
|---|---|---|
| PATENT NO. | : 7,724,837 B2 | Page 1 of 1 |
| APPLICATION NO. | : 10/546012 | |
| DATED | : May 25, 2010 | |
| INVENTOR(S) | : Filimonov et al. | |

It is certified that error appears in the above-identified patent and that said Letters Patent is hereby corrected as shown below:

Column 12, Claim 3, Line 22: Please correct "RE" to read -- RF --

Signed and Sealed this

Twenty-sixth Day of October, 2010

David J. Kappos
*Director of the United States Patent and Trademark Office*